United States Patent
Hoshi et al.

(10) Patent No.: US 7,204,881 B2
(45) Date of Patent: Apr. 17, 2007

(54) SILICON WAFER FOR EPITAXIAL GROWTH, AN EPITAXIAL WAFER, AND A METHOD FOR PRODUCING IT

(75) Inventors: Ryoji Hoshi, Fukushima (JP); Susumu Sonokawa, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 144 days.

(21) Appl. No.: 10/520,099

(22) PCT Filed: Jul. 8, 2003

(86) PCT No.: PCT/JP03/08671

§ 371 (c)(1),
(2), (4) Date: Jan. 4, 2005

(87) PCT Pub. No.: WO01/27362

PCT Pub. Date: Apr. 19, 2001

(65) Prior Publication Data

US 2005/0211158 A1 Sep. 29, 2005

(30) Foreign Application Priority Data

Jul. 12, 2002 (JP) ............................. 2002-204703

(51) Int. Cl.
*C30B 15/04* (2006.01)
(52) U.S. Cl. ............................. 117/19; 117/13; 117/20; 117/932
(58) Field of Classification Search ............. 117/13, 117/14, 19, 20, 932
See application file for complete search history.

(56) References Cited

U.S. PATENT DOCUMENTS

| 6,548,035 B1* | 4/2003 | Kimura et al. ........... 423/328.2 |
| 6,843,847 B1* | 1/2005 | Iida et al. .................... 117/13 |
| 2002/0000189 A1 | 1/2002 | Tanaka et al. |

FOREIGN PATENT DOCUMENTS

| JP | A-2000-044389 | 2/2000 |
| JP | A-2000-109396 | 4/2000 |

(Continued)

OTHER PUBLICATIONS

Talid Sinno et al.; "Modeling Microdefect Formation in Czochralski Silicon"; *Journal of the Electrochemical Society*; 146 (6); 1999; pp. 2300-2312.

*Primary Examiner*—Felisa Hiteshew
(74) *Attorney, Agent, or Firm*—Oliff & Berridge, PLC

(57) ABSTRACT

There are disclosed a silicon wafer for epitaxial growth wherein the wafer is produced by slicing a silicon single crystal grown with doping nitrogen according to the Czochralski method (CZ method) in the region where at least the center of the wafer becomes V region in which the void type defects are generated, and wherein the number of defects having an opening size of 20 nm or less among the void type defects appearing on the surface of the wafer is $0.02/cm^2$ or less, and an epitalial wafer wherein an epitaxial layer is formed on the silicon wafer for epitaxial growth. Thereby, there can be produced an epitaxial wafer having a high gettering capability wherein very few SF exist in the epitaxial layer easily at high productivity and at low cost.

29 Claims, 6 Drawing Sheets

FOREIGN PATENT DOCUMENTS

| | | |
|---|---|---|
| JP | A-2000-219598 | 8/2000 |
| JP | WO 01/27362 A1 | 4/2001 |
| JP | A-2001-151596 | 6/2001 |
| JP | A-2001-274167 | 10/2001 |
| JP | A-2002-012499 | 1/2002 |
| JP | A-2002-076007 | 3/2002 |

* cited by examiner

Comparative Example 3 (F=0.60)

Comparative Example 2 (F=0.45)

Comparative Example 1 (F=0.40)

Note) Particles cannot be counted in the peripheral part due to overflow.

100nm

US 7,204,881 B2

1

SILICON WAFER FOR EPITAXIAL GROWTH, AN EPITAXIAL WAFER, AND A METHOD FOR PRODUCING IT

TECHNICAL FIELD

The present invention relates to an epitaxial wafer (hereinafter occasionally referred to as just "epi-wafer") which is excellent in gettering capability to capture a harmful heavy metal impurity, and has few crystal defects existing in an epitaxial layer and is excellent in crystallinity, and a silicon wafer for epitaxial growth for producing it, and a method of producing it.

BACKGROUND ART

The epitaxial silicon wafer has been widely used for many years as a wafer for producing an individual semiconductor, a bipolar IC, or the like because of the outstanding characteristics thereof. Moreover, since a soft error and a latch-up quality thereof are excellent also as for MOS LSI, it has been widely used for a microprocessor unit or a flash memory device. Furthermore, the need of epi-wafer has been expanded increasingly in order to reduce lowering of reliability of DRAM due to a so-called grown-in defect introduced at the time of production of a silicon single crystal.

If a heavy metal impurity exists in the epi-wafer used for such a semiconductor device, it will become a cause of poor characteristics of the semiconductor device. Cleanliness needed especially for the latest device is considered to be a concentration of a heavy metal impurity of $1 \times 10^9$ atoms/cm$^2$ or less, and thus the heavy metal impurity existing in epi-wafer should be decreased as much as possible.

There is a gettering technique as one of the techniques for reducing such a heavy metal impurity, and the importance of the gettering technique is becoming higher in recent years. One of the very effective methods as gettering technique is a method called Intrinsic gettering (IG) wherein oxygen precipitates (BMD: Bulk micro defect) are formed in a silicon wafer, and a heavy metal impurity is caught at the distorted place. However, since the epi-wafer is generally subjected to high temperature heat treatment in order to deposit an epitaxial layer (hereinafter occasionally referred to as just "epi-layer") on a silicon wafer, the nuclei of oxygen precipitation which have been grown to some extent in the heat environment at the time of growing of crystal are disappeared due to the high temperature heat treatment in the epitaxial process, and it may cause a problem that BMD is hard to be formed.

Then, in order to solve such a problem, it has been proposed in Japanese Patent Application Laid-open (Kokai) No. 2000-44389, that the silicon single crystal in which nitrogen is doped is used as a substrate on which an epitaxial layer is formed. If nitrogen is doped, the nucleus of oxygen precipitation due to nitrogen (uneven nucleus) is formed in the silicon single crystal, and the nucleus of oxygen precipitation cannot be disappeared easily in heat treatment at the time of formation of the epi-layer, and thus the epi-wafer with high gettering capability can be produced.

On the other hand, it has been known that stacking faults (SF) will be generated on an epi-layer in an epi-wafer. If a device is produced on SF generated in the epi-layer, leak of electric current or the like will be generated and it will cause poor characteristics. It is known that if impurity exists on a substrate, the SF is formed with it as a starting point in the process wherein an epi-layer is being deposited. Therefore, in the case that an epi-layer is formed, the epi-layer is usually formed with being controlled so that impurities such as a particle may not exist on a substrate.

However, it was made clear that the cause of generation of SF in an epi-layer is generated due to not only impurities such as a particle, but also grown-in defects which exist near the surface of the wafer formed at the time of growth of the silicon single crystal as a starting point, as indicated in Japanese Patent. Application Laid-open (Kokai) No. 2001-151596. It was also revealed that the probability is very high in the epi-wafer in which nitrogen is doped as compared with the epi-wafer in which nitrogen is not doped. In Japanese Patent Application Laid-open (Kokai) No. 2001-151596, it is proposed to use as a substrate the wafer in which a grown-in defect does not exist in a surface layer in order to prevent generation of SF. Specifically, it is proposed to use as a substrate for epitaxial growth the wafer sliced from a single crystal produced so that grown-in defects may not be generated using the special manufacture condition wherein a rate of crystal growth is strictly controlled when the crystal is grown, or the wafer subjected to annealing processing to eliminate defects in a surface layer of the wafer.

However, such methods may cause significant lowering of productivity and a remarkable cost rise in production of an epitaxial wafer, since they use a special method for producing a crystal, and the wafer wherein no crystal defect exists in a surface layer of the wafer should be produced by performing annealing processing which needs special equipment and operation cost, according to these methods.

DISCLOSURE OF THE INVENTION

The present invention has been accomplished to solve the above-mentioned problems. An object of the present invention is to produce an epitaxial wafer with high quality wherein gettering capability is high and SF which have a bad influence on device characteristics are very few on an epitaxial layer at high productivity and at low cost.

In order to solve the above-mentioned problems, the present invention provides a silicon wafer for epitaxial growth, wherein the wafer is produced by slicing a silicon single crystal grown with doping nitrogen according to the Czochralski method (CZ method) in the region where at least the center of the wafer becomes V region in which void type defects are generated and wherein the number of defects having an opening size of 20 nm or less among the void type defects appearing on a surface of the wafer is 0.02/cm$^2$ or less.

As described above, if it is the silicon wafer for epitaxial growth produced by slicing a silicon single crystal grown with doping nitrogen according to the Czochralski method (CZ method) in the region where at least the center of the wafer becomes V region in which void type defects are generated wherein the number of defects having an opening size of 20 nm or less among the void type defects appearing on the surface of the wafer is 0.02/cm$^2$ or less, it can be a silicon wafer for epitaxial growth having a high gettering capability and generation of SF is suppressed at the time of epitaxial growth.

In this case, it is desirable that the above-mentioned V region exists in the range of 80% or more of a plane of the wafer.

The V region where a void type defect is generated preferably occupies wider region in a plane of the wafer. If the V region exists in the range of 80% or more of a plane of the wafer as described above, there can be produced a silicon wafer wherein the number of the void type defects having an opening size of 20 nm or less which appear on the surface of the wafer is surely 0.02/cm² or less on the whole surface.

Moreover, it is desirable that a concentration of nitrogen doped in the above-mentioned silicon single crystal is $1\times10^{13}$ to $1\times10^{14}$/cm³.

As described above, if a concentration of nitrogen doped in the silicon single crystal is $1\times10^{13}$/cm³ or more, a nucleus of oxygen precipitation will not disappear in a bulk part of the wafer even if epitaxial growth is performed at a high temperature, and thus there can be obtained the silicon wafer for epitaxial growth which is the epitaxial wafer having a high gettering capability. Moreover, if a concentration of nitrogen doped in the silicon single crystal is $1\times10^{14}$/cm³ or less, production of a single crystal will not be prevented when the silicon single crystal is grown, and thus the silicon wafer for epitaxial growth with high quality can be obtained.

According to the present invention, there can be provided an epitaxial wafer, wherein an epitaxial layer is formed on the surface of the above-mentioned silicon wafer for epitaxial growth of the present invention and the number of the stacking faults (SF) appearing on the epitaxial layer can be 0.02/cm² or less.

If it is such an epitaxial wafer of the present invention, there can be obtained an epitaxial wafer with high quality having a high gettering capability and SF generated in an epitaxial layer are very few, especially the number of SF is 0.02/cm² or less.

Moreover, according to the present invention, there is provided a method for producing a silicon wafer for epitaxial growth wherein a silicon wafer for epitaxial growth is produced by growing a silicon single crystal with doping nitrogen according to the CZ method, with controlling F/G (mm²/min·K) in the range of 0.30 or more where F (mm/min) is a rate of crystal growth and G (K/mm) is a temperature gradient near growth interface when the silicon single crystal is grown, and with controlling a passage time (min) at 1150 to 1050° C. in the range of 40 minutes or more, in the region wherein at least the center of the wafer becomes V region in which void type defects are generated, and then slicing the grown silicon single crystal.

As described above, if the silicon wafer is produced by growing a silicon single crystal with doping nitrogen according to the CZ method, with controlling F/G (mm²/min·K) which is a ratio of a rate of crystal growth F and a temperature gradient G in the range of 0.30 or more, and with controlling a passage time (min) at 1150 to 1050° C. in the range of 40 minutes or more, in the region wherein at least center of the wafer becomes V region, and then slicing the grown silicon single crystal, there can be produced a silicon wafer for epitaxial growth wherein nitrogen is doped, and the number of the defects having an opening size of 20 nm or less among the void type defects appearing on the surface of the wafer is 0.02/cm² or less, easily without performing any special processes, and the silicon wafer for epitaxial growth which can produce an epitaxial wafer having a high gettering capability and generation of SF is suppressed at epitaxial growth can be easily produced at excellent productivity and at low cost.

In this case, it is desirable that the above-mentioned F/G is 0.35 or more when the above-mentioned silicon single crystal is grown.

Since superfluous vacancies can be introduced into a silicon single crystal at high density and a size of a void type defect can be easily enlarged by controlling F/G at 0.35 or more when the silicon single crystal is grown as described above, the number of the void type defect having an opening size of 20 nm or less which appears in the surface of a silicon wafer can be certainly made 0.02/cm² or less, and thus the silicon wafer for epitaxial growth having a better quality can be produced.

Moreover, it is desirable that the silicon single crystal is grown so that the above-mentioned V region may exist in the region of 80% or more of a plane of the wafer.

Since superfluous vacancies can be easily introduced into a silicon single crystal by growing a silicon single crystal so that the V region may exist in the region of 80% or more of a plane of the wafer as described above, the number of the void type defects having an opening size of 20 nm or less which appears in the surface of the silicon wafer can be surely made 0.02/cm² or less almost all over the plane of the wafer.

Furthermore, it is desirable that a concentration of nitrogen doped in the above-mentioned silicon single crystal is $1\times10^{13}$ to $1\times10^{14}$/cm³.

As described above, if a concentration of nitrogen doped in the silicon single crystal is $1\times10^{13}$/cm³ or more, a nucleus of oxygen precipitation is certainly formed in a silicon single crystal, and thus there can be produced a silicon wafer for epitaxial growth wherein a nucleus of oxygen precipitation is not eliminated even if epitaxial growth at a high temperature is performed. Moreover, if a concentration of nitrogen doped in the silicon single crystal is $1\times10^{14}$/cm³ or less, formation of single crystal is not prevented when a silicon single crystal is grown.

According to the present invention, an epitaxial wafer can be produced by forming an epitaxial layer on a surface of the silicon wafer for epitaxial growth produced by the production method of the silicon wafer for epitaxial growth of the present invention.

As described above, if nitrogen is doped in the silicon wafer for epitaxial growth produced by the production method of the silicon wafer for epitaxial growth of the present invention, and the number of the defects having an opening size of 20 nm or less among the void type defects appearing on the surface of the wafer is 0.02/cm² or less, the epitaxial wafer with high quality wherein gettering capability is high and SF are very few in an epitaxial layer can be easily produced at a high productivity and at low cost by forming an epitaxial layer on the surface of the silicon wafer for epitaxial growth.

Furthermore, according to the present invention, there is provided a method for producing an epitaxial wafer by forming an epitaxial layer on a surface of a silicon wafer, comprising using a silicon wafer wherein the silicon wafer is produced by slicing a silicon single crystal grown according to the CZ method with doping nitrogen in the region where at least the center of the wafer becomes V region in which the void type defects are generated and wherein the number of the defects having an opening size of 20 nm or less among the void type defects appearing on a surface of the wafer is 0.02/cm² or less.

If the epitaxial layer is formed on the surface of the silicon wafer as mentioned above, the epitaxial wafer with high quality having a high gettering capability and very few SF exist in the epitaxial layer can be easily produced at high productivity and at low cost.

As explained above, according to the present invention, there can be easily produced an epitaxial wafer with high quality having high gettering capability and SF generated in an epitaxial layer are very few at high productivity and at low cost.

BEST MODE FOR CARRYING OUT THE INVENTION

The present invention will be explained below in detail, but the present invention is not limited thereto.

Conventionally, doping of nitrogen in a silicon wafer which serves as a substrate for epitaxial growth has been performed in order to improve a gettering capability of an epitaxial wafer. However, when the epitaxial layer was formed on the silicon wafer in which nitrogen is doped in this way, SF is generated in the epi-layer at high density, and there is caused the problem of making a bad chip at the time of fabrication of a device.

Then, the inventors of the present invention have made experiments and studied thoroughly in order to product an epitaxial wafer wherein generation of SF in an epi-layer is reduced even if nitrogen is doped in the silicon wafer for epitaxial growth, and as a result, they found that it is effective to use a silicon wafer wherein the number of the defects having an opening size of 20 nm or less among the void type defects appearing on the surface of the wafer is 0.02 number/$cm^2$ or less, as a substrate for epitaxial growth, studied various conditions for production of a silicon wafer, and thereby completed the present invention.

At first, the inventors of the present invention tried to investigate in which case SF is generated on the epi-wafer with grown-in defect as a start point. For it, they grow a silicon single crystal with varying a size of grown-in defect to produce various silicon wafers each having grown-in defect with a different size by changing a rate of crystal growth gradually when growing a silicon single crystal with doping nitrogen.

Hereafter, a grown-in defect will be explained briefly. Generally, it is known that defects have been already generated in a silicon single crystal grown by the CZ method at the time of growing crystal, and they are called grown-in defect. The grown-in defects include an Interstitial type defect and a Vacancy type defect (so-called void type defect).

Figure 8:
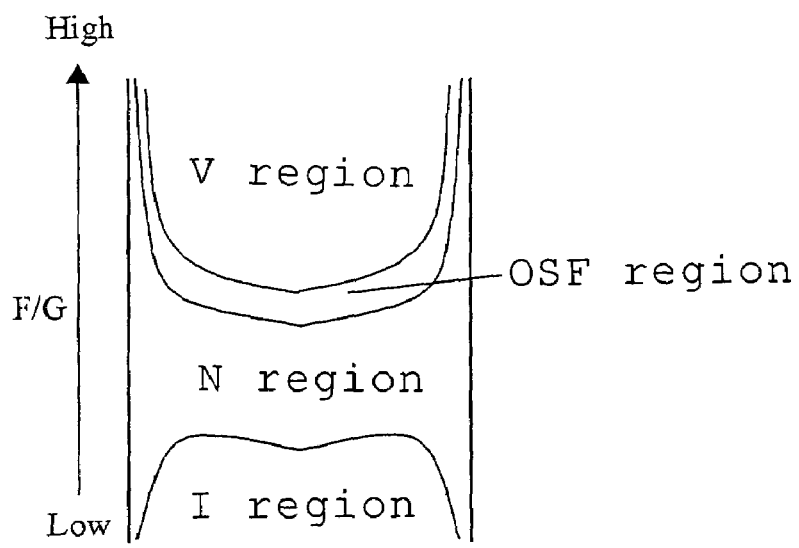
FIG. 8 is a view which shows a relation between crystal defects introduced when a silicon single crystal is grown and F/G.

It is known that generation of these defects is defined by the relation F/G which is a rate of crystal growth F (mm/min) and crystal temperature gradient G (K/mm) near a solid-liquid interface in an axis of pulling when pulling a silicon single crystal by the CZ method. It is known that Vacancy will be superior (V region) as shown in FIG. 8 if the F/G is large, on the contrary, Interstitial silicon will be superior (I region) if F/G is small.

Moreover, there is a neutral region (hereinafter referred to as N region) wherein there are no (few) excesses and deficiencies in atom, and it has been confirmed that there is a defect called OSF (Oxidation Induced Stacking Fault) between this V region and I region by performing thermal oxidation, which is generated in a ring shape in a cross section perpendicular to an axis of crystal growth.

If the silicon wafer produced in I region is used as a substrate for epitaxial growth among the silicon wafers produced in each range, there is caused a disadvantage such as generation of a lot of defects in a projection shape on an epi-layer or the like, as disclosed in Japanese Patent Application Laid-open (Kokai) No. 2000-219598. Accordingly, it is preferable to use the silicon wafer produced in V region as a substrate for epitaxial growth in order to prevent generation of such defects, and to improve productivity or the like. Then, in the present invention, the following experiments were conducted in the case of growing the crystal in the range wherein at least center of the wafer becomes V region in which the void type defects are generated, when growing a silicon single crystal by the CZ method.

In order to investigate the relation between a void type defect and SF generated on the epi-wafer, the silicon single crystal was grown with changing a rate of crystal growth gradually to vary a size of a void type defect, and a silicon wafer was produced, as described above.

That is, when the temperature gradient G near the crystal-growth interface is fixed, F/G can be changed by changing a rate of crystal growth F. In this case, a density of superfluous vacancies introduced immediately after crystallization of silicon can be changed by changing F/G in V region. For example, if F/G is made large in V region, a density of superfluous vacancies introduced into a silicon single crystal can be made high. A void type defect is formed as a result of aggregation of the superfluous vacancies via heating history thereafter. If heating history thereafter is the same, a void type defect gets larger with more of the superfluous vacancies, namely with larger F/G.

Then, using this behavior, the silicon single crystal wherein a size of a void type defect was changed was grown by doping nitrogen by the CZ method and by changing a rate of crystal growth gradually to control F/G. After forming an epitaxial layer on each silicon wafer sliced from the crystal, it was evaluated by measuring a number of SF appearing on the epi-layer. As a result, it was turned out that the number of SF generated on an epi-layer was significantly increased in the epi-wafer produced from the silicon wafer of which F/G was small when the crystal was grown, i.e., a silicon wafer wherein a size of a void type defect was small.

From the above fact, it was revealed that SF generated on an epi-layer due to a void type defect is generated with the void type defect of which size is small as a start point. Then, observation with a transmission electron microscope (TEM), computer simulation DEFGEN.X (T. Sinno and R. A. Brown, Journal of Electrochemical Society, Vol. 146, pp 2300 (1999)), or the like were performed, to investigate the size of the void type defect in which SF is generated on an epi-layer. As a result, it has become clear that SF is generated due to the defect of which opening size is 20 nm or less among the void type defects appearing on the surface of a wafer.

Figure 10:
FIG. 10 is an enlarged view of a result of observation of a cross section of a silicon wafer in which nitrogen is doped.

In addition, in the case of computer simulation, there exist a lot of defects wherein two or more vacancies in a wafer are gathered. Although a size of such defect wherein vacancies are gathered becomes several nm in some cases, it is considered that such a defect wherein several vacancies are gathered does not form SF on an epi-layer. Therefore, the defect of which opening size which appears in the above-mentioned wafer surface is 20 nm or less is only defects recognized as a void type defect, which accompany a inner-wall oxide film. For example, as shown in FIG. 10, it shows those of which an opening size of the portion appearing on the surface of the wafer is 20 nm or less among the defects in a shape of a cylinder or plate generated in the silicon wafer in which nitrogen is doped.

From the above results, if an epitaxial layer is formed on a silicon wafer wherein there exist almost no void type defects having an opening size of 20 nm or less on the surface of the wafer by growing the void type defects, there can be produced an epitaxial wafer wherein SF have not been generated on an epi-layer. However, there is a distribution in a size of a defect actually, and the number of the void type defects in which an opening size is 20 nm or less appearing on the surface of a wafer never become zero also from simulation, and the several void type defects having an opening size of 20 nm or less inevitably exist on a silicon wafer.

Therefore, the number of the void type defects of which an opening size is 20 nm or less among the void type defects appearing on a surface of a wafer should just be 0.02 number/cm$^2$ or less, actually. The number of such void type defects was defined by the quality level of an actual realistic epi-wafer. For example, in the epitaxial wafer produced from the silicon wafer in which nitrogen is not doped, at least several SF are generated in a plane of the wafer. However, even if a device is fabricated on such an epi-wafer in which several SF, especially SF of 0.02 number/cm$^2$ or less are generated, a device yield is not lowered extremely due to SF. Accordingly, SF in such a level can be almost disregarded at the present device fabrication process.

Namely, if it is the silicon wafer for epitaxial growth produced by slicing a silicon single crystal grown with doping nitrogen according to the CZ method in the region wherein at least center of the wafer becomes V region in which the void type defects are generated wherein the number of the defects having an opening size of 20 nm or less among the void type defects appearing on the surface of the wafer is 0.02/cm$^2$ or less, it can be the silicon wafer for epitaxial growth having a high gettering capability and generation of SF was suppressed at the time of epitaxial growth. It can be considered as the silicon wafer for epitaxial growth that high quality epitaxial wafer having high gettering capability and SF are few in the epitaxial layer can be produced.

Next, the method for producing such a silicon wafer for epitaxial growth will be explained.

As mentioned above, in order to produce a silicon wafer for epitaxial growth wherein the number of the defects having an opening size of 20 nm or less among the void type defects appearing on the surface of the wafer is 0.02/cm$^2$ or less, it is necessary to control appropriately the relation F/G (mm$^2$/min·K) of a rate of crystal growth F (mm/min) and crystal temperature gradient G (K/mm) near a solid-liquid interface in an axis of pulling when pulling a silicon single crystal with doping nitrogen by the CZ method.

Figure 9:
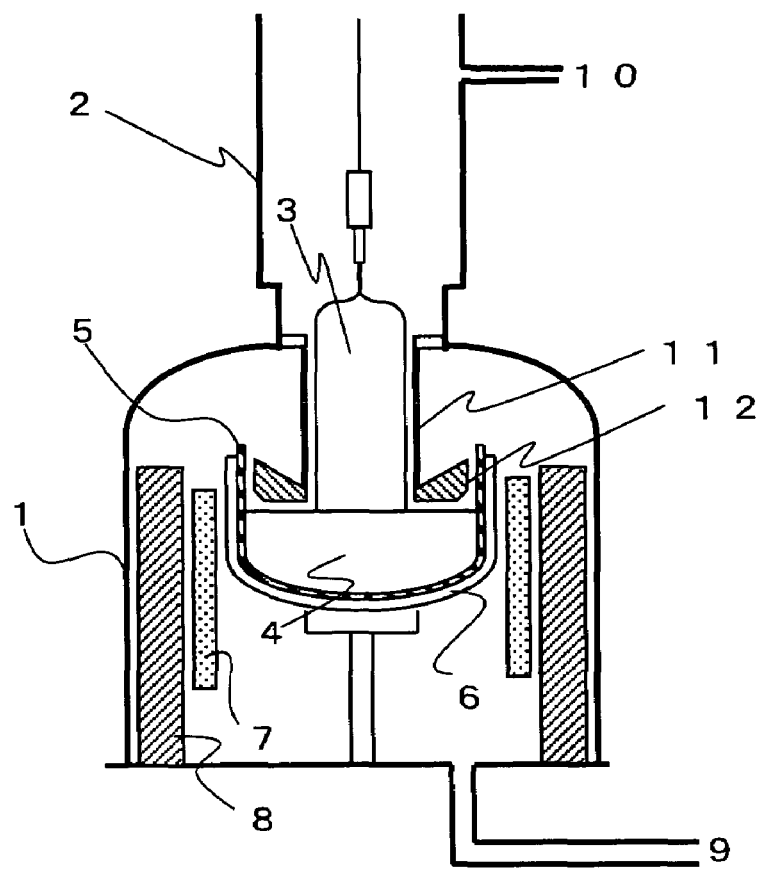
FIG. 9 is a schematic view of an apparatus for growing a single crystal used in the present invention.

An example of an apparatus for growing a silicon single crystal according to the CZ method used in the present invention is shown in FIG. 9. The apparatus for growing a silicon single crystal includes a quartz crucible 5 with which a silicon melt 4 was filled up, a graphite crucible 6 which protects this, a heater 7 disposed around the crucibles 5, 6 and insulating material 8 placed in a main chamber 1. A pulling chamber 2 for housing a grown single crystal 3 and taking out it is connected to the upper part of this main chamber 1.

In order to grow a silicon single crystal 3 using such an apparatus for growing a single crystal, after a seed crystal is immersed in the silicon melt 4 in the quartz crucible 5, it is pulled up calmly with being rotated to grow a cylindrical single crystal 3 via necking. On the other hand, the crucible 5, 6 can be moved up and down to a direction of an axis of crystal growth, the crucible is raised so that a level of the melt descended by crystallization during crystal growth may be compensated, and thereby, the height of the surface of the melt is kept constant. Moreover, inert gas such as argon gas is introduced in the main chamber 1 from the gas inlet port 10 prepared in the upper part of the pulling chamber 2, and passes between the single crystal 3 being pulled and the gas flow guide cylinder 11, and then passes between the lower part of a heat insulating component 12 and a surface of a melt, and is exhausted from the gas outlet port 9.

Since a density of vacancies introduced in a single crystal is defined by the value of F/G as mentioned above when a silicon single crystal is grown as described above, controlling F/G is one of the most important factors for controlling a size of the void type defect formed in a silicon single crystal. That is, if the F/G is small, density of superfluous vacancies introduced in a silicon single crystal will also become small, and as a result, a size of the void type defect will become small. Therefore, in order to enlarge a size of a void type defect, and to grow a silicon single crystal wherein the number of the void type defect with a small size is reduced, it is important to grow a silicon single crystal with enlarging the value of F/G to some extent.

Then, in order to know F/G for producing the silicon wafer wherein the number of the defects having an opening size of 20 nm or less among the void type defects appearing on the surface of the wafer is 0.02/cm$^2$ or less, a suitable F/G was experimentally calculated by growing a silicon single crystal with varying F/G, and observing the surface of each of the obtained wafers. As a result, it has been revealed that if F/G is 0.30 or more, superfluous vacancies can be introduced in a silicon single crystal at sufficient density.

In this case, it is desirable that F/G is larger in order that superfluous vacancies can be introduced in a silicon single crystal at higher density. However, the upper limit of the rate of crystal growth F for growing up a silicon single crystal with a diameter of 200 mm or more safely is usually 3 mm/min and the minimum value of the temperature gradient G which enables crystallization of a silicon single crystal is about 0.3 K/mm, and thus it is desirable that F/G is 10.00 or less at most.

Moreover, if F/G is 0.30 or more as described above, superfluous vacancies can be introduced in a silicon single crystal at sufficient density. If time for aggregation of superfluous vacancies and formation of a void type defect is short, the size of the void type defect will become small. Therefore, it is important to set passage time at a temperature range of 1150 to 1050° C. which is considered to affect a size of a void type defect at a certain time or more, when growing a silicon single crystal. Then, as a result of investigating the suitable passage time at 1150 to 1050° C. temperature range by the results of the experiments and the simulation conducted this time, or the like, it has been revealed that the time of 40 minutes or more is suitable.

In addition, the passage time at 1150 to 1050° C. is computed as a value wherein a temperature range at 1150 to 1050° C. determined according to a configuration in a furnace of an apparatus for growing a single crystal is divided with a rate of crystal growth. The passage time at 1150 to 1050° C. can be lengthened without limit if a rate of crystal growth F is made small, and it is preferable to be longer in the possible range in order that the void type defect of which size is large can be formed. However, if the productivity of a silicon single crystal is taken into consideration, or if it is in the range of a rate of crystal growth satisfying the condition such that F/G may be 0.30 or more as mentioned above, the upper limit of passage time at 1150 to 1050° C. is naturally restricted. When shown concretely, the lower limit of the rate of crystal growth which is materialized industrially at present at which a certain productivity can be secured is 0.1 mm/min, and a range of a temperature at 1150 to 1050° C. in an apparatus for producing a single crystal is 200 mm at the longest, and thus it is desirable that the passage time at 1150 to 1050° C. is 2000 minutes or less.

Namely, by using as a method for producing a silicon wafer for epitaxial growth a method of growing a silicon single crystal with doping nitrogen by the CZ method, controlling F/G (mm$^2$/min·K) in the range of 0.30 or more with setting a rate of crystal growth when a silicon single crystal is grown as F (mm/min) and a temperature gradient near growth interface as G (K/mm), and with controlling a passage time (min) at 1150 to 1050° C. in the range of 40 minutes or more, there can be easily produced at high productivity and at low cost a silicon wafer for epitaxial growth wherein nitrogen is doped, and the number of the defects having an opening size of 20 nm or less among the void type defects appearing on the surface of the wafer is 0.02/cm$^2$ or less, without such extra processing as annealing at a high temperature or the like.

In this case, by setting F/G at 0.35 or more when a silicon single crystal is grown, superfluous vacancies can be introduced into a silicon single crystal at high density, and a size of a void type defect can be enlarged easily. Therefore, it is possible to make the number of the defects having an opening size of 20 nm or less among the void type defects appearing on the surface of the wafer to 0.02/cm$^2$ or less surely and to produce a silicon wafer for epitaxial growth with a better quality.

Moreover, it is desirable that the V region where the void type defect is generated occupies wider range in a plane of a wafer, especially V region exists in the range of 80% or more of the plane of the wafer. By growing a silicon single crystal as described above, superfluous vacancies can be easily introduced in almost all over the plane of the wafer, and thus there can be obtained a silicon wafer wherein the number of the void type defect in which the opening size which appears in the surface of a silicon wafer is 20 nm or less is 0.02/cm$^2$ or less in almost all over the plane.

Moreover, it is desirable that a concentration of the nitrogen doped in the silicon single crystal is $1\times10^{13}$/cm$^3$ or more when a silicon single crystal is grown with doping nitrogen by the CZ method. As described above, if a concentration of the nitrogen doped in the silicon single crystal is $1\times10^{13}$/cm$^3$ or more, a nucleus of oxygen precipitation is certainly formed in a silicon single crystal, a nucleus of oxygen precipitation which is formed is not eliminated even if epitaxial growth at a high temperature is performed, and thus there can be produced a silicon wafer for epitaxial growth having high gettering capability. Moreover, if a concentration of the nitrogen doped in the silicon single crystal is more than $1\times10^{14}$/cm$^3$, it may lead to lowering of productivity by formation of single crystal may be prevented when a silicon single crystal is grown. Therefore, it is preferable that a concentration of nitrogen doped in the silicon single crystal is $1\times10^{14}$/cm$^3$ or less.

After producing the silicon wafer for epitaxial growth as mentioned above, an epitaxial wafer can be manufactured by forming an epitaxial layer on the surface of this silicon wafer for epitaxial growth.

Namely, an epitaxial wafer can be produced by using as a silicon wafer a silicon wafer produced by slicing a silicon single crystal grown according to the CZ method with doping nitrogen in the region wherein at least center of the wafer becomes V region in which the void type defects are generated wherein the number of the defects having an opening size of 20 nm or less among the void type defects appearing on the surface of the wafer is 0.02/cm$^2$ or less, and forming an epitaxial layer on the surface of the silicon wafer.

By producing an epitaxial wafer as described above, there can be easily produced at high productivity and at low cost an epitaxial wafer with high quality with high gettering capability and very few SF having a bad influence on device characteristics exist in the epitaxial layer, especially the number of SF appearing on the surface of the epitaxial layer is 0.02 number/cm$^2$ or less.

In addition, a method of forming an epitaxial layer on the surface of a silicon wafer is not especially limited, and the epitaxial layer can be formed by using a method which is usually performed.

Although the present invention will be explained more concretely hereafter with referring to Examples and Comparative examples, the present invention is not limited thereto.

EXAMPLE 1

First, 320 kg of a silicon raw material was charged into a quartz crucible having a diameter of 800 mm, and a nitrogen-doped silicon single crystal with a diameter of 300 mm and a body length of 120 cm was grown according to MCZ method with applying a horizontal magnetic field at a central magnetic field intensity of 4000 G, at an average rate of crystal growth F of 0.68 mm/min so as to grow a silicon single crystal at V region. At this time, nitrogen was doped in the silicon single crystal at a concentration in the range of $2\times10^{13}$ to $9\times10^{13}$/cm$^3$.

Figure 1:
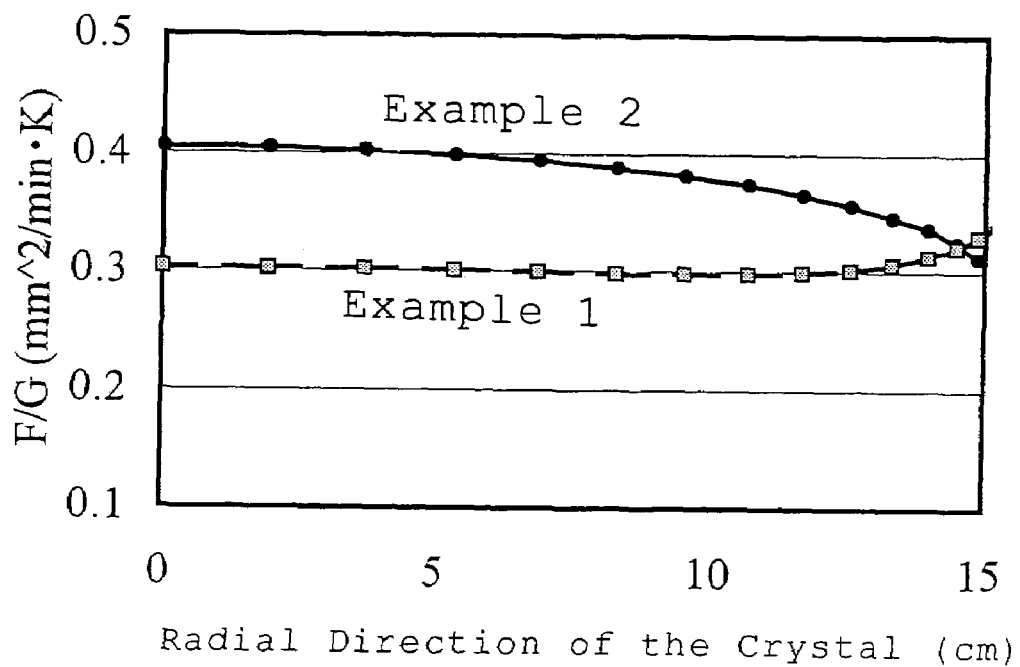
FIG. 1 is a view showing a distribution of F/G in a radial direction of a crystal in Examples 1 and 2.
Figure 2:
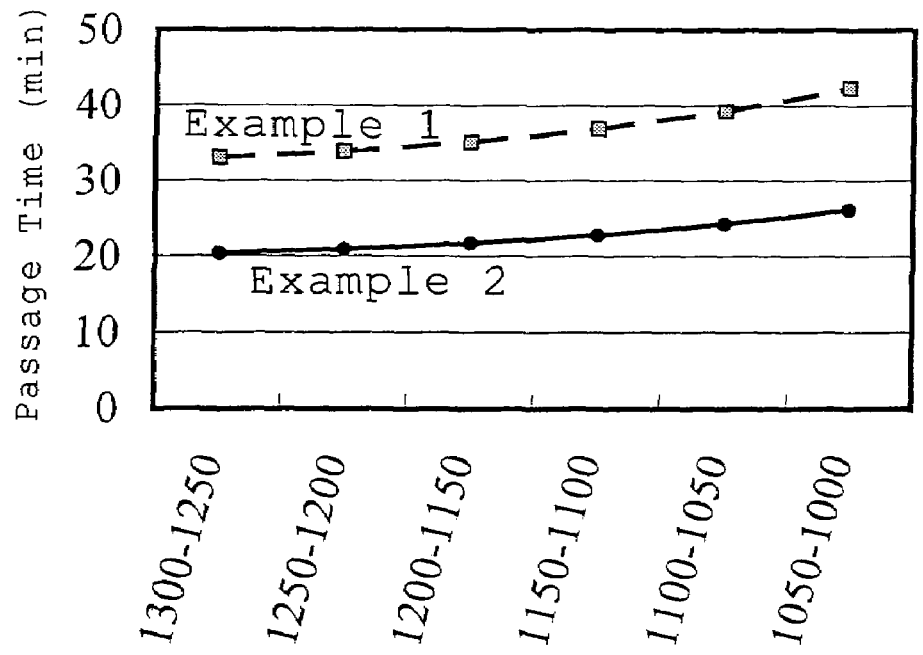
FIG. 2 is a view showing a passage time in each temperature range in Examples 1 and 2.
Figure 3:
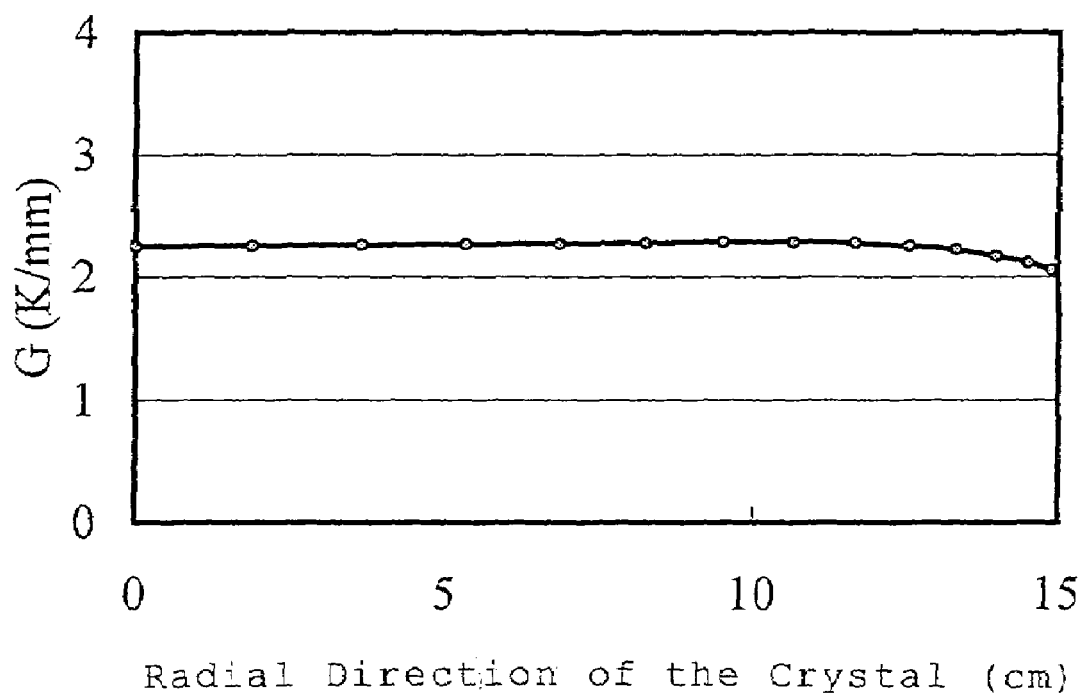
FIG. 3 is a view showing a distribution in a radial direction of a crystal of a temperature gradient G (K/mm) near a growth interface in HZ used in Example 1 and Comparative Examples 1–3.
Figure 4:
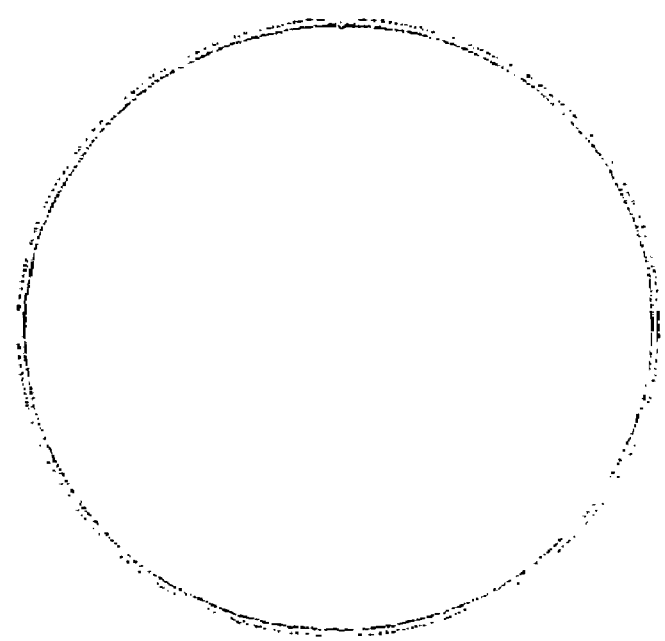
FIG. 4 is a view showing a result of observation of particles on an epitaxial layer in the epitaxial wafer of Example 2 with SP1.

As a result of investigating a distribution of temperature gradient G in HZ (hot zone) used for growing of crystal in this case in a radial direction of the crystal, the distribution as shown in FIG. 3 was obtained. Moreover, the distribution of F/G in the radial direction of crystal was as shown in FIG. 1, the value of F/G at a center part was 0.30 and V region occupied in 80% or more (100%) in a radial direction at 0.30 or more. Furthermore, a passage time at 1150 to 1050° C. was measured, and it was 76 minutes as shown in FIG. 2.

A wafer was sliced from the silicon single crystal produced as described above, and subjected to lapping, chamfering and polishing to produce a silicon wafer for epitaxial growth. The epitaxial layer with a thickness of 4 μm was formed on this silicon wafer for epitaxial growth at 1130° C. Then, particles (with a size of 0.09 μm or more) on the surface of the epitaxial layer were counted by a particle counter Surfscan SP1 (manufactured by KLA-Tencor corporation). As a result, 14 particles were observed on the 300 mmφ wafer (0.020/cm$^2$). Furthermore, when the surface of the epitaxial layer was observed using a multi-laser confocal check system M350 (MAGICS, manufactured by Lasertech corporation), it was shown that 8/300 mmφ wafer (0.011/cm$^2$) were SF. As a result, it was revealed that there were very few SF even though nitrogen was doped, and it was a high quality epitaxial wafer.

EXAMPLE 2

There was prepared an apparatus for growing a single crystal which has HZ wherein although homogeneity of a temperature gradient G in a radial direction of a crystal was spoiled, a rate of crystal growth F can be made higher, and as a result F/G can be made larger compared with Example 1. 320 kg of a silicon raw material was charged into a quartz crucible having a diameter of 800 mm in the apparatus, and a nitrogen-doped silicon single crystal with a diameter of 300 mm and a body length of 120 cm was grown according to MCZ method with applying a horizontal magnetic field at a central magnetic field intensity of 3500 G, at an average rate of crystal growth F of 1.10 mm/min so as to grow a silicon single crystal at V region. At this time, nitrogen was doped in the silicon single crystal at a concentration in the range of $2\times10^{13}$ to $9\times10^{13}$/cm$^3$.

Moreover, the distribution of F/G in the radial direction of a crystal was as shown in FIG. 1, the value of F/G at a center part was 0.41 and V region occupied in 80% or more in a radial direction at 0.35 or more. Furthermore, a passage time at 1150 to 1050° C. was measured, and it was 47 minutes as shown in FIG. 2.

According to a similar method to Example 1, a silicon wafer for epitaxial growth was produced from the silicon single crystal produced, and an epitaxial layer with a thickness of 4 μm was formed on this silicon wafer for epitaxial growth at 1130° C. Then, particles on the surface of the epitaxial layer were counted by a particle counter SP1 as described in Example 1. As a result, 3 particles were observed on the 300 mmφ wafer (0.004/cm$^2$). Furthermore, when the surface of the epitaxial layer was observed using MAGICS, it was shown that 2/300 mmφ wafer (0.003/cm$^2$) were SF. Accordingly, a higher quality epitaxial wafer wherein fewer SF exist compared with Example 1 could be obtained.

COMPARATIVE EXAMPLES 1–3

Using the same hot zone as Example 1, 320 kg of a silicon raw material was charged into a quartz crucible having a diameter of 800 mm in the apparatus, and a nitrogen-doped silicon single crystal with a diameter of 300 mm and a body length of 120 cm was grown according to MCZ method with applying a horizontal magnetic field at a central magnetic field intensity of 4000 G, with gradually reducing an average rate of crystal growth F from 0.7 mm/min to 0.3 mm/min. At this time, nitrogen was doped in the silicon single crystal at a concentration in the range of $2\times10^{13}$ to $9\times10^{13}$/cm$^3$. The distribution of G in the radial direction of a crystal was the same as Example 1.

The sample wafer was sliced from the produced silicon single crystal, and the position where OSF was generated in a single crystal was investigated. Investigation of the location where OSF was generated was carried out by performing wet oxidization at 1150° C. for 100 minutes, then performing preferential etching with mixed acid with selectivity which consists of fluoric acid, nitric acid, acetic acid and water, and performing observation of the sample wafer under a condensing light with a microscope. Consequently, OSF was generated on the whole surface at a position corresponding to a rate of growth of 0.40 mm/min.

Figure 5:
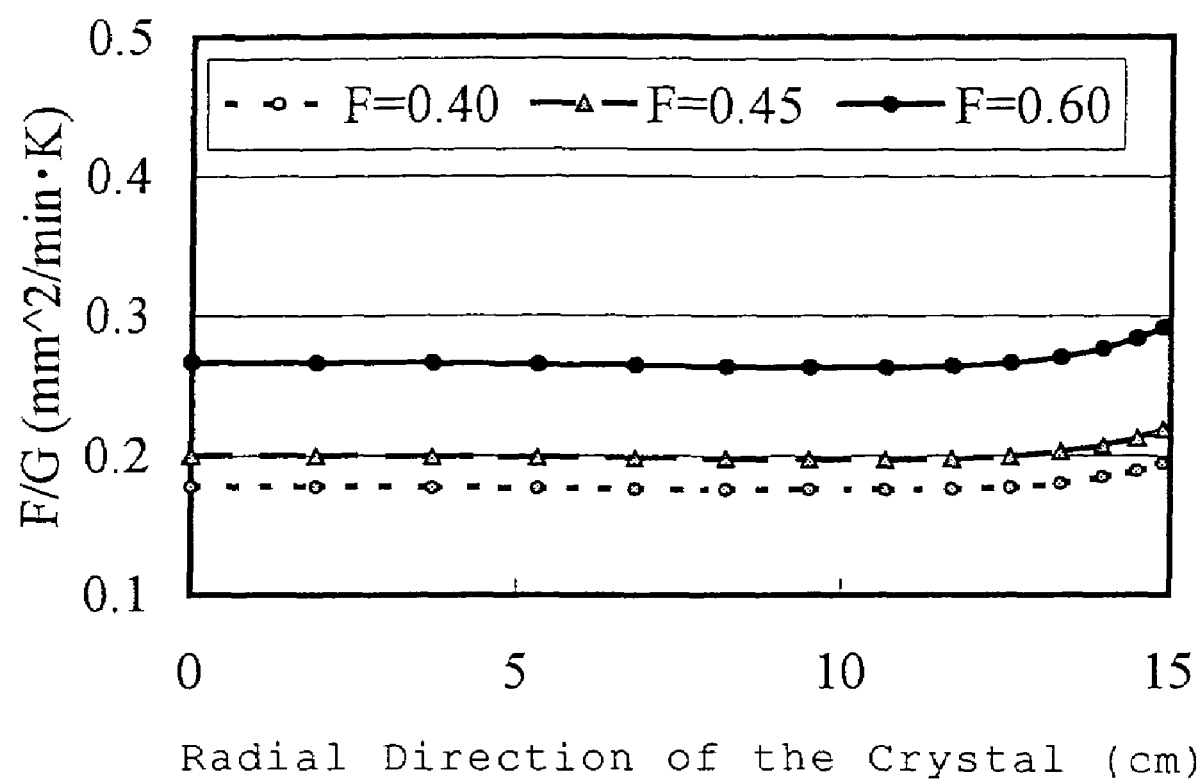
FIG. 5 is a view showing a distribution of F/G in a plane in Comparative examples 1–3.

Then, silicon wafers for epitaxial growth were produced from the part corresponding to a rate of growth of 0.40 mm/min (Comparative example 1), 0.45 mm/min (Comparative example 2), and 0.60 mm/min (Comparative example 3) in the similar manner to Example 1. At this time, F/G in each position of the silicon single crystal of the sliced wafer was determined, and they were shown in FIG. 5. F/G at the center of each wafer was respectively 0.18, 0.20 and 0.27. They do not satisfy the requirements of the present invention. Furthermore, the defects which exist in a wafer surface of the silicon wafer for epitaxial growth of Comparative Example 1 were observed with TEM, and it was confirmed that defects with an opening size of 20 nm or less were easy to find, and exist quite a lot on the surface of the wafer.

Figure 6:
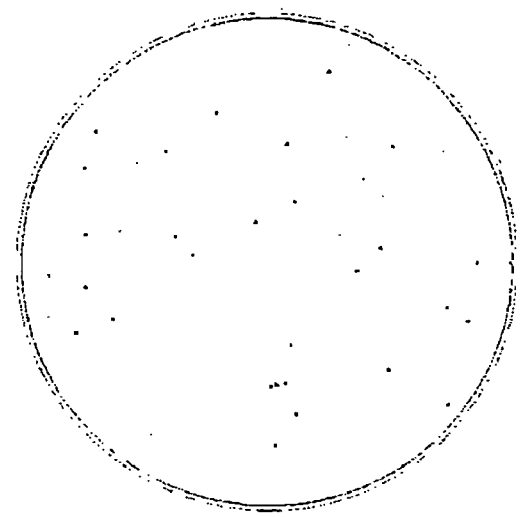
FIG. 6 is a view showing a result of observation of particles on an epitaxial layer in the epitaxial wafer of Comparative Examples 1 to 3 with SP1.
Figure 6:
Figure 6:
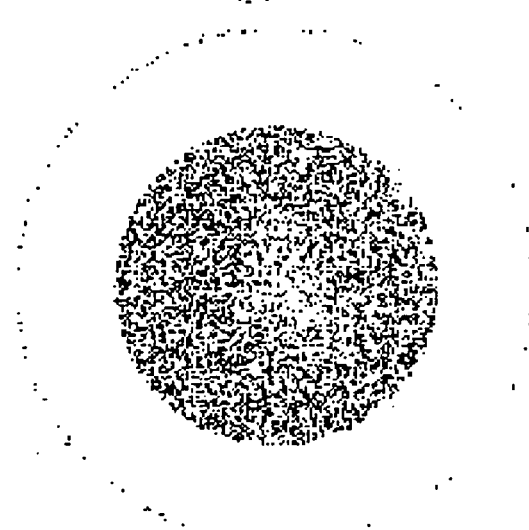

Then, after an epitaxial layer with a thickness of 4 μm was formed on this silicon wafer for epitaxial growth at 1130° C., particles on the surface of the epitaxial layer were counted by a particle counter SP1. As a result, as shown in FIG. 6, a lot of particles were observed on every wafer, although the number of the particles was reduced with increase of a rate of crystal growth. On the epi-wafer of Comparative Example 1 shown in FIG. 6, particles cannot be counted to a peripheral part, since particles were too many to be counted with this particle counter. On the epi-wafer of Comparative Examples 2 and 3, respectively particles of 17384/300 mmφ wafer (24.6/cm$^2$) and 33/300 mmφ wafer (0.047/cm$^2$) were measured. Furthermore, when observation was performed using MAGICS, SF of 18/300 mmφ wafer (0.025/cm$^2$) were observed on the epi-wafer of Comparative Example 3, and it was revealed that it was the epi-wafer with low quality compared with those in which nitrogen was not doped, although SF were significantly reduced compared with Comparative Example 1 wherein a rate of crystal growth was low and those having an opening size of 20 nm or less exist at high density.

Figure 7:
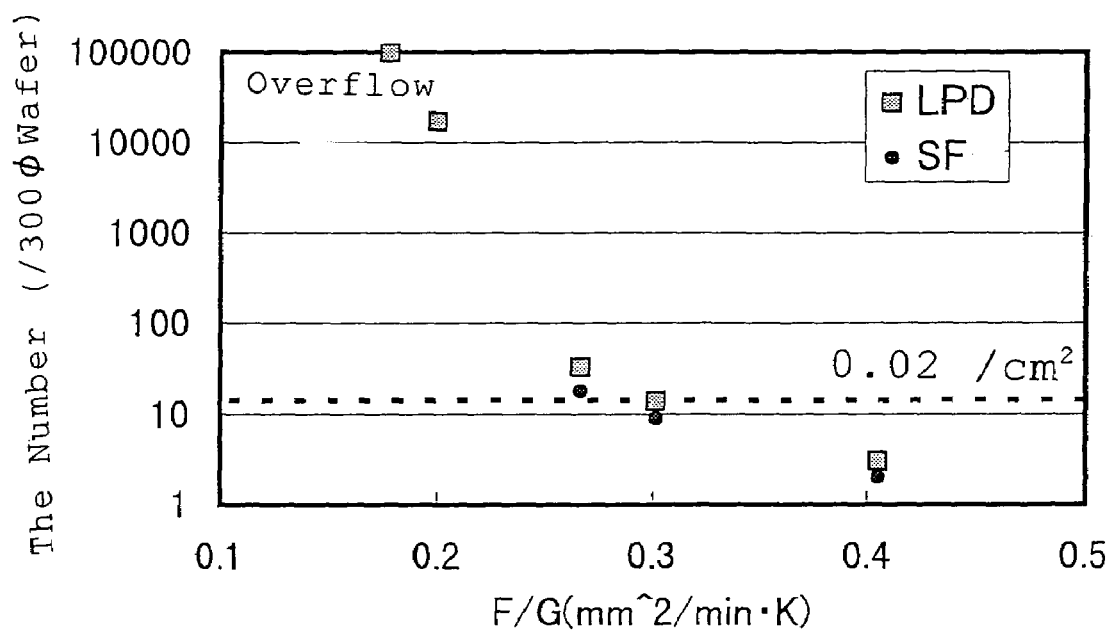
FIG. 7 is a graph wherein the number of particles (LPD: Light Point Defect) and SF in the epitaxial wafers of Examples 1 and 2 and Comparative Examples 1–3 are plotted.

Moreover, the number of the particles and SF observed in each epitaxial wafer produced in the above-mentioned Examples 1 and 2 and Comparative Examples 1–3 were plotted in FIG. 7 with setting F/G at the central part of the wafer as a horizontal axis. Also from FIG. 7, a high quality epitaxial wafer wherein the number of SF generated on the epitaxial layer is 0.02/cm$^2$ or less can be obtained by setting F/G at 0.30 or more.

In addition the present invention is not limited to the above-described embodiment. The above-described embodiment is a mere example, and those having the substantially same structure as that described in the appended claims and providing the similar working effects are included in the scope of the present invention.

For example, although the case where a silicon single crystal with a diameter of 300 mm was grown with impressing a magnetic field in the above-mentioned Example, the present invention is not limited thereto, a silicon single crystal may have a diameter of 200 mm, 350 mm or a longer diameter. Furthermore, the present invention can be applied to the case wherein a magnetic field is not impressed when a silicon single crystal is grown.

The invention claimed is:

1. A silicon wafer for epitaxial growth, wherein the wafer is produced by slicing a silicon single crystal grown with doping nitrogen according to the Czochralski method (CZ method) in the region where at least the center of the wafer becomes V region in which void defects are generated and wherein the number of defects having an opening size of 20 nm or less among the void defects appearing on a surface of the wafer is $0.02/cm^2$ or less.

2. The silicon wafer for epitaxial growth according to claim 1, wherein the V region exists in the range of 80% or more of a plane of the silicon wafer.

3. The silicon wafer for epitaxial growth according to claim 2, wherein a concentration of nitrogen doped in the silicon single crystal is $1\times10^{13}$ to $1\times10^{14}/cm^3$.

4. An epitaxial wafer, wherein an epitaxial layer is formed on the surface of the silicon wafer for epitaxial growth according to claim 3.

5. The epitaxial wafer according to claim 4, wherein the number of stacking faults (SF) appearing on the epitaxial layer is $0.02/cm^2$ or less.

6. An epitaxial wafer, wherein an epitaxial layer is formed on the surface of the silicon wafer for epitaxial growth according to claim 2.

7. The epitaxial wafer according to claim 6, wherein the number of stacking faults (SF) appearing on the epitaxial layer is $0.02/cm^2$ or less.

8. The silicon wafer for epitaxial growth according to claim 1, wherein a concentration of nitrogen doped in the silicon single crystal is $1\times10^{13}$ to $1\times10^{14}/cm^3$.

9. An epitaxial wafer, wherein an epitaxial layer is formed on the surface of the silicon wafer for epitaxial growth according to claim 8.

10. The epitaxial wafer according to claim 9, wherein the number of stacking faults (SF) appearing on the epitaxial layer is $0.02/cm^2$ or less.

11. An epitaxial wafer, wherein an epitaxial layer is formed on the surface of the silicon wafer for epitaxial growth according to claim 1.

12. The epitaxial wafer according to claim 11, wherein the number of stacking faults (SF) appearing on the epitaxial layer is $0.02/cm^2$ or less.

13. A method for producing a silicon wafer for epitaxial growth wherein a silicon wafer for epitaxial growth is produced by growing a silicon single crystal with doping nitrogen according to the CZ method, with controlling F/G ($mm^2/min \cdot K$) in the range of 0.30 or more where F (mm/min) is a rate of crystal growth and G (K/mm) is a temperature gradient near growth interface when the silicon single crystal is grown, and with controlling a passage time (min) at 1150 to 1050° C. in the range of 40 minutes or more, in the region wherein at least the center of the wafer becomes V region in which void defects are generated, and then slicing the grown silicon single crystal.

14. The method for producing a silicon wafer for epitaxial growth according to claim 13, wherein the F/G is 0.35 or more when the silicon single crystal is grown.

15. The method for producing a silicon wafer for epitaxial growth according to claim 14, wherein the silicon single crystal is grown so that the V region exists in the region of 80% or more of a plane of the silicon wafer.

16. The method for producing a silicon wafer for epitaxial growth according to claim 15, wherein a concentration of nitrogen doped in the silicon single crystal is $1\times10^{13}$ to $1\times10^{14}/cm^3$.

17. A method for producing an epitaxial wafer by forming an epitaxial layer on a surface of the silicon wafer for epitaxial growth produced by the method according to claim 16.

18. A method for producing an epitaxial wafer by forming an epitaxial layer on a surface of the silicon wafer for epitaxial growth produced by the method according to claim 15.

19. The method for producing a silicon wafer for epitaxial growth according to claim 14, wherein a concentration of nitrogen doped in the silicon single crystal is $1\times10^{13}$ to $1\times10^{14}/cm^3$.

20. A method for producing an epitaxial wafer by forming an epitaxial layer on a surface of the silicon wafer for epitaxial growth produced by the method according to claim 19.

21. A method for producing an epitaxial wafer by forming an epitaxial layer on a surface of the silicon wafer for epitaxial growth produced by the method according to claim 14.

22. The method for producing a silicon wafer for epitaxial growth according to claim 13, wherein the silicon single crystal is grown so that the V region exists in the region of 80% or more of a plane of the silicon wafer.

23. The method for producing a silicon wafer for epitaxial growth according to claim 22, wherein a concentration of nitrogen doped in the silicon single crystal is $1\times10^{13}$ to $1\times10^{14}/cm^3$.

24. A method for producing an epitaxial wafer by forming an epitaxial layer on a surface of the silicon wafer for epitaxial growth produced by the method according to claim 23.

25. A method for producing an epitaxial wafer by forming an epitaxial layer on a surface of the silicon wafer for epitaxial growth produced by the method according to claim 22.

26. The method for producing a silicon wafer for epitaxial growth according to claim 13, wherein a concentration of nitrogen doped in the silicon single crystal is $1\times10^3$ to $1\times10^{14}/cm^3$.

27. A method for producing an epitaxial wafer by forming an epitaxial layer on a surface of the silicon wafer for epitaxial growth produced by the method according to claim 26.

28. A method for producing an epitaxial wafer by forming an epitaxial layer on a surface of the silicon wafer for epitaxial growth produced by the method according to claim 13.

29. A method for producing an epitaxial wafer by forming an epitaxial layer on a surface of a silicon wafer, comprising using a silicon wafer wherein the silicon wafer is produced by slicing a silicon single crystal grown according to the CZ method with doping nitrogen in the region where at least the center of the wafer becomes V region in which void defects are generated and wherein the number of the defects having an opening size of 20 nm or less among the void defects appearing on a surface of the wafer is $0.02/cm^2$ or less.

* * * * *

UNITED STATES PATENT AND TRADEMARK OFFICE
CERTIFICATE OF CORRECTION

PATENT NO. : 7,204,881 B2 Page 1 of 1
APPLICATION NO. : 10/520099
DATED : April 17, 2007
INVENTOR(S) : Ryoji Hoshi and Susumu Sonokawa It is certified that error appears in the above-identified patent and that said Letters Patent is hereby corrected as shown below:

On the cover page, column 1:

Paragraph [87], replace "WO01/27362" with --WO04/07815-- and replace "Apr.19, 2001" with --Jan. 22, 2004--

Signed and Sealed this

Twenty-seventh Day of November, 2007

JON W. DUDAS
*Director of the United States Patent and Trademark Office*